United States Patent
Kang

(10) Patent No.: US 8,699,279 B2
(45) Date of Patent: Apr. 15, 2014

(54) SEMICONDUCTOR MEMORY DEVICE AND SEMICONDUCTOR SYSTEM

(75) Inventor: Tae Jin Kang, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 180 days.

(21) Appl. No.: 13/336,876

(22) Filed: Dec. 23, 2011

(65) Prior Publication Data

US 2013/0114347 A1  May 9, 2013

(30) Foreign Application Priority Data

Nov. 4, 2011  (KR) .................. 10-2011-0114799

(51) Int. Cl.
*G11C 7/10* (2006.01)
(52) U.S. Cl.
USPC .................. 365/189.05; 365/194; 365/201; 365/189.011; 365/189.15; 365/200; 365/233.1

(58) Field of Classification Search
USPC ........ 365/189.05, 194, 201, 189.011, 189.15, 365/200, 233.1
See application file for complete search history.

(56) References Cited

U.S. PATENT DOCUMENTS 6,477,095 B2  11/2002  White et al.
2012/0036405 A1*  2/2012  Iizuka ..................... 714/723

FOREIGN PATENT DOCUMENTS

KR  1020100107783 A  10/2010

* cited by examiner

*Primary Examiner* — Fernando Hidalgo
(74) *Attorney, Agent, or Firm* — William Park & Associates Patent Ltd.

(57) ABSTRACT

A semiconductor system includes a semiconductor memory device configured to, during a test mode, store received data in a memory cell in response to a write command, read the stored data as information data in response to a read command, and internally store the information data, in response to the read command, in synchronization with a pulse generated when a level of the information data changes.

18 Claims, 4 Drawing Sheets

SEMICONDUCTOR MEMORY DEVICE AND SEMICONDUCTOR SYSTEM

CROSS-REFERENCES TO RELATED APPLICATIONS

The present application claims priority under 35 U.S.C 119(a) to Korean Application No. 10-2011-0114799 filed on Nov. 4, 2011 in the Korean intellectual property Office, which is incorporated by reference in its entirety.

BACKGROUND

In general, a semiconductor system performs a fail test in order to improve reliability to detect faulty semiconductor memory devices. The fail test is performed by the following process: identical data are written into memory cells and then read to check whether the semiconductor memory device fails the fail test. Whether the semiconductor memory device fails (has a fail) may be determined based on whether the written data are identical to the read data. That is, when the written data are identical to the read data the semiconductor memory device is determined to be a good device, and when the written data are different from the read data the semiconductor memory device is determined to be a bad, or fail, device.

After the fail test, information on the fail of the semiconductor device is internally stored. The store operation is performed in synchronization with a delayed clock signal which is internally generated during a read operation, and the delayed clock signal is generated by delaying a clock signal generated in synchronization with a read command.

However, when a skew occurs in the semiconductor memory device due to a PVT (Process, Voltage, and Temperature) variation, it is difficult to adjust timing at which information on a memory cell determined as a fail cell is stored in synchronization with the delayed clock signal. Therefore, it may be difficult to store the fail information of the semiconductor memory device in a reliable way.

SUMMARY

An embodiment of the present invention relates to a semiconductor memory device and a semiconductor system that generates a pulse based on fail information of the semiconductor memory device and stores the fail information in synchronization with the pulse. Therefore, the fail information of the semiconductor memory device may be reliably stored although there may be a clock skew due to PVT variation.

In one embodiment, a semiconductor system includes a semiconductor memory device configured to, during a test mode, store received data in a memory cell in response to a write command, read the stored data as information data in response to a read command, and internally store the information data in synchronization with a pulse generated when a level of the information data changes in response to the read command.

In another embodiment, a semiconductor memory device includes a memory unit configured to output data stored in a memory cell by a write operation as test data in synchronization with a read clock signal generated in response to a read command, a sense amplification unit configured to sense and amplify the test data in synchronization with a delayed clock signal generated by delaying the read clock signal and output the amplified data as the information data, a pulse generation unit configured to generate a pulse signal including a pulse generated when the level of the information data changes, and a storage unit configured to store the information data in response to the pulse signal.

In another embodiment, a method of operating a semiconductor device during a test mode may include storing received data in a memory cell in response to a write command, reading the stored data as information data in response to a read command, and internally storing the information data in synchronization with a pulse generated when a level of the information data changes in response to a read command.

BRIEF DESCRIPTION OF THE DRAWINGS

The above and other aspects, features, and advantages will be more clearly understood from the following detailed description taken in conjunction with the accompanying drawings.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
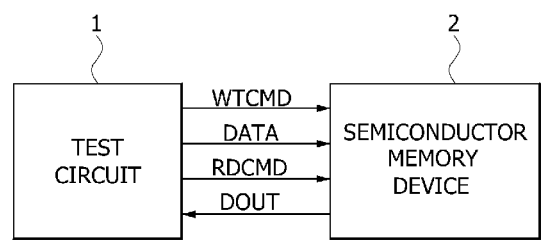
FIG. 1 is a block diagram illustrating an exemplary configuration of a semiconductor system in accordance with an embodiment of the present invention.

FIG. 1 is a block diagram illustrating an exemplary configuration of a semiconductor system in accordance with an embodiment of the present invention.

Figure 2:
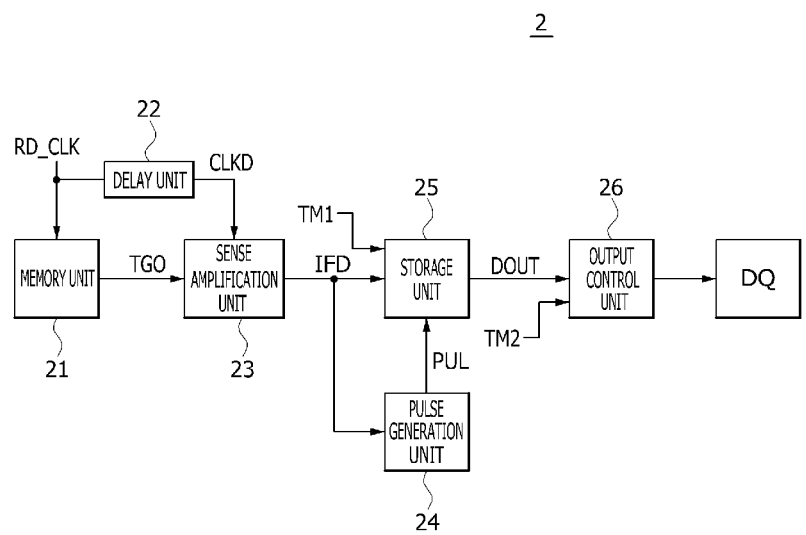
FIG. 2 is a block diagram illustrating an exemplary configuration of a semiconductor memory device included in the semiconductor system of FIG. 1.

Referring to FIG. 1, the semiconductor system in accordance with the embodiment of the present invention includes a test circuit 1 and a semiconductor memory device 2. The test circuit 1 is configured to apply a write command WTCMD and data DATA for a write operation, apply a read command RDCMD for a read operation, and receive output data DOUT according to the read operation. The semiconductor memory device 2 is configured to store the data DATA in a memory cell (not illustrated) in response to the write command WTCMD, internally store fail information in response to the read command RDCMD, and output the stored fail information as the output data DOUT. Referring to FIG. 2, the configuration of the semiconductor memory device 2 will be described in more detail as follows.

Referring to FIG. 2, the semiconductor memory device 2 includes a memory unit 21, a delay unit 22, a sense amplification unit 23, a pulse generation unit 24, a storage unit 25, and an output control unit 26. The memory unit 21 includes a plurality of memory cells for storing the data DATA during a write operation performed according to the write command WTCMD, and is configured to output the data stored in the memory cells as test data TGO in synchronization with a read clock signal RD_CLK generated in response to the read command RDCMD. The delay unit 22 is configured to delay the read clock signal RD_CLK by a preset period and generate a delayed clock signal CLKD. The sense amplification unit 23 is configured to sense and amplify the test data TGO in synchronization with the delayed clock signal CLKD, and output the amplified data as information data IFD. The pulse generation unit 24 is configured to generate a pulse signal PUL including a pulse which occurs when the level of the information data IFD changes. The storage unit 25 is configured to store the information data IFD when the pulse of the pulse signal PUL is inputted, and output the stored data as output data DOUT in response to a first test mode signal TM1. The output control unit 26 is configured to output the output data DOUT to a data pad DQ in response to a second test mode signal TM2. Here, the information data IFD is set in such a manner as to have the same logic level as the data DATA applied from the test circuit 1 when the semiconductor memory device 2 has no fail, and have a different logic level from the data DATA when the semiconductor memory device 2 has a fail. Basically, the data DATA has the same logic level as the test data TGO read from the memory unit 21.

Figure 3:
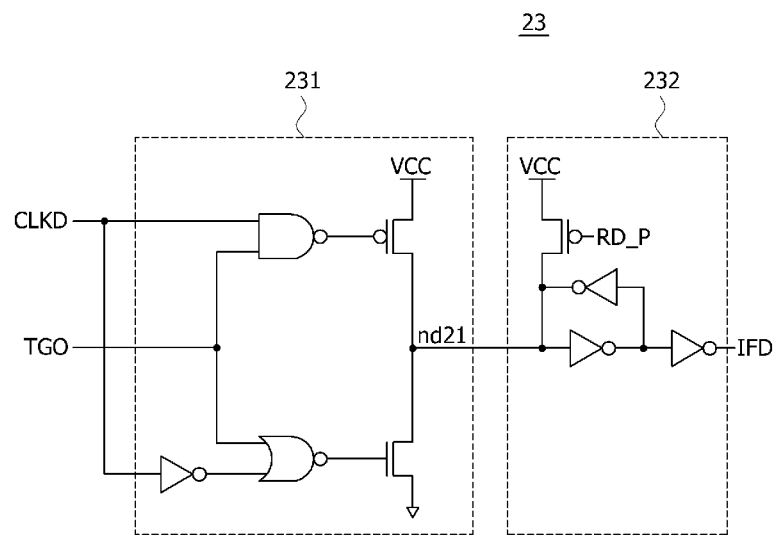
FIG. 3 is a circuit diagram of an exemplary sense amplification unit included in the semiconductor memory device of FIG. 2.
Figure 4:
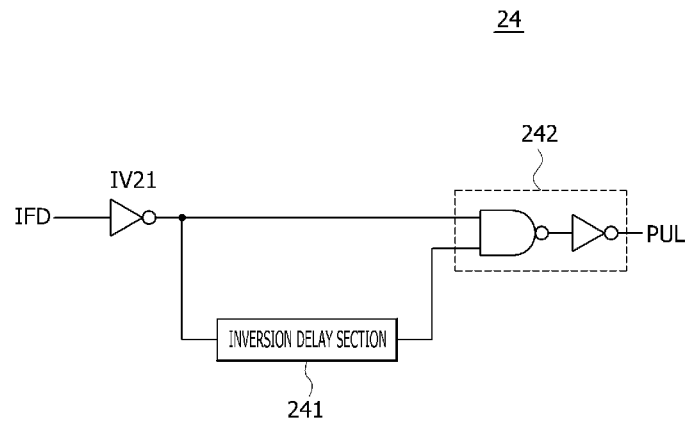
FIG. 4 is a circuit diagram of an exemplary pulse generation unit included in the semiconductor memory device of FIG. 2.
Figure 5:
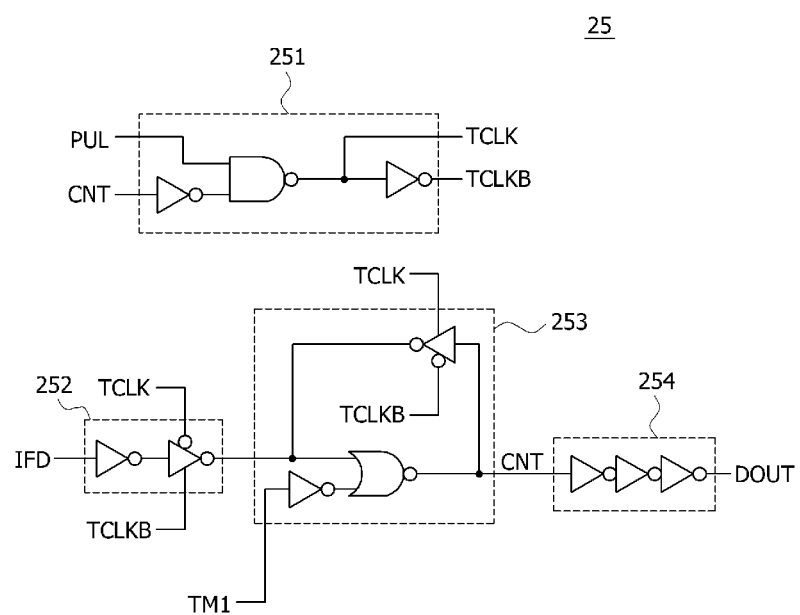
FIG. 5 is a circuit diagram of an exemplary storage unit included in the semiconductor memory device of FIG. 2.

Referring to FIGS. 3 to 5, the configurations of the sense amplification unit 23, the pulse generation unit 24, and the storage unit 25, which are illustrated in FIG. 2, will be described in more detail.

Referring to FIG. 3, the sense amplification unit 23 includes a driving section 231 and a precharge buffer section 232. The driving section 231 is configured to drive an internal node nd21 in response to the test data TGO in synchronization with the delayed clock signal CLKD. The precharge buffer section 232 is configured to precharge the internal node nd21 in response to a read pulse RD_P, buffer a signal of the internal node nd21, and output the buffered signal as the information data IFD. Here, the read pulse RD_P is a signal asserted to a logic high level during a read operation. The sense amplification unit 23 configured in such a manner drives the internal node nd21 according to the level of the test data TGO, buffers the signal of the internal node nd21, and outputs the buffered signal as the information data IFD when the delay clock signal CLKD is at a logic high level.

Referring to FIG. 4, the pulse generation unit 24 includes an inverter IV21, an inversion delay section 241, and a logic section 242. The pulse generation unit 24 is configured to generate a pulse signal PUL including a pulse which is generated at a falling edge of the information data IFD, that is, when the information data IFD changes from a logic high level to a logic low level.

Referring to FIG. 5, the storage unit 25 includes a test clock generation section 251, an input section 252, a control signal generation section 253, and a buffer section 254. The test clock generation section 251 is configured to generate a test clock signal TCLK and an inverted test clock signal TCLKB in response to the pulse signal PUL and a control signal CNT. The input section 252 is configured to receive and buffer the information data IFD in response to the test clock signal TCLK and the inverted test clock signal TCLKB. The control signal generation section 253 is configured to precharge the control signal CNT to a logic low level in response to the first test mode signal TM1, buffer the data inputted through the input section 252, output the buffered data as the control signal CNT, and latch and store the control signal in response to the test clock signal TCLK and the inverted test clock signal TCLKB. The buffer section 254 is configured to invert and buffer the control signal CNT and outputs the buffered signal as the output data DOUT.

The storage unit 25 configured in such a manner generates the control signal CNT and the output data DOUT according to the pulse signal PUL when the first test mode signal TM1 is at a logic high level. That is, when a pulse of the pulse signal PUL is not generated because no fail occurred in the semiconductor memory device, the test clock signal TCLK is generated at a logic high level, and the inverted test clock signal TCLKB is generated at a logic low level. Therefore, the control signal CNT is latched and stored. The control signal CNT maintains a state in which it is precharged at a logic low level, and, therefore, the output data DOUT is at a logic high level. When a pulse of the pulse signal PUL is generated because a fail occurred in the semiconductor memory device, the test clock signal TCLK is generated at a logic low level, and the inverted test clock signal TCLKB is generated at a logic high level. Therefore, the low-level information data IFD is inputted through the input section 252 such that the control signal CNT changes to a logic high level and the output data DOUT changes to a logic low level.

Figure 6:
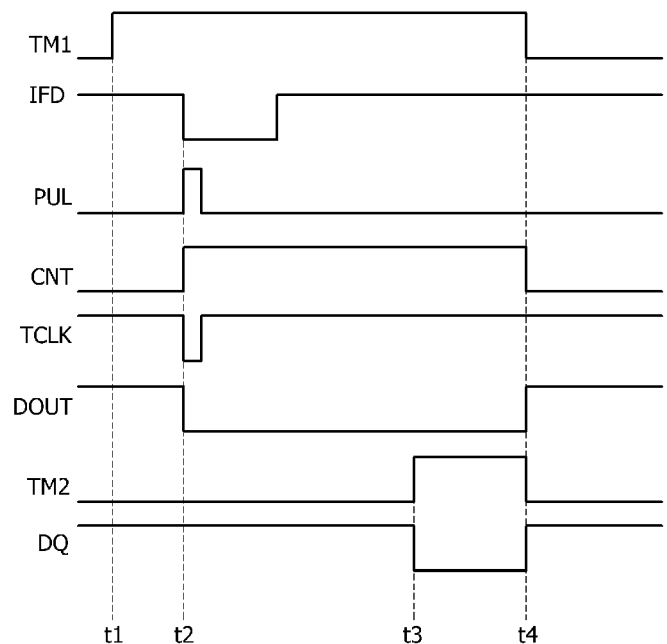
FIG. 6 is an exemplary timing diagram explaining a fail test performed in the semiconductor system of FIG. 1.

Referring to FIG. 6, a fail test performed in the semiconductor system configured in the above-described manner will be described in more detail. The following descriptions will be focused on the operation after logic high level data DATA is stored in the memory unit 21 by a write operation.

First, since the first test mode signal TM1 is at a logic low level during a period prior to a time point t1, the control signal CNT is precharged at a logic low level, and the output data DOUT has a logic high level. Since the pulse signal PUL is reset to a logic low level to generate a logic high level test clock signal TCLK and a complementary logic low level inverted test clock signal TCLKB, the control signal CNT is latched and stored.

When the information data IFD changes to a logic low level at a time point t2 after the first test mode signal TM1 changed to a logic high level at the time point t1, a pulse of the pulse signal PUL occurs to generate a logic low level test clock signal TCLK. Therefore, the control signal CNT changes to a logic high level because the logic low level information data IFD is transmitted, and the output data DOUT changes to a logic low level.

After the pulse of the pulse signal PUL is inputted, the test clock signal TCLK changes to a logic high level to latch and store the control signal CNT which changed to a logic high level. Therefore, the output data DOUT maintains a logic low level.

Then, during a period from a time point t3 to a time point t4, in which the second test mode signal TM2 is at a logic high level, the logic low level output data DOUT is outputted to the data pad DQ.

As described above, when a fail occurs in the semiconductor device, a pulse of the pulse signal PUL is generated to store and output the low-level information data IFD. Since the pulse of the pulse signal PUL is a signal which is generated when the information data IFD changes from a logic high level to a logic low level, the pulse is not affected by a skew which occurs depending on a PVT variation. Therefore, when a fail test is performed by the semiconductor system, it is possible to reliably store fail information of the semiconductor memory device although there may be a skew depending on PVT variation.

The embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. A semiconductor system comprising:
a semiconductor memory device configured to, during a test mode, store received data in a memory cell in response to a write command;
read the stored data as information data in response to a read command;
internally store the information data, in response to the read command, in synchronization with a pulse generated when a level of the information data changes; and
a test circuit configured to transmit the write command and data for the write operation, transmit the read command for a read operation, and receive the output data according to the read operation.

2. The semiconductor system of claim 1, wherein the semiconductor memory device outputs the stored information data as the output data in response to a test mode signal.

3. The semiconductor system of claim 2, wherein the semiconductor memory device comprises:
a memory unit configured to output the data stored in the memory cell as test data in synchronization with a read clock signal generated in response to the read command;
a sense amplification unit configured to sense and amplify the test data in synchronization with a delayed clock signal generated by delaying the read clock signal and output the amplified data as the information data;
a pulse generation unit configured to generate a pulse signal including the pulse generated when the level of the information data changes; and
a storage unit configured to store the information data in response to the pulse signal.

4. The semiconductor system of claim 3, wherein the storage unit outputs the stored information data as the output data in response to a first test mode signal.

5. The semiconductor system of claim 4, further comprising an output control unit configured to output the output data to a data pad in response to a second test mode signal.

6. The semiconductor system of claim 3, wherein the sense amplification unit comprises:
a driving section configured to receive the test data and drive an internal node in synchronization with the delayed clock signal; and
a precharge buffer section configured to precharge the internal node, buffer a signal of the internal node, and output the buffered signal as the information data during a read operation period.

7. The semiconductor system of claim 3, wherein the pulse generation unit generates a pulse in response to a falling edge of the information data.

8. The semiconductor system of claim 3, wherein the storage unit generates the output data by latching a control signal precharged in response to a first test mode signal, and generates the output data by receiving and latching the information data when a pulse of the pulse signal is generated.

9. The semiconductor system of claim 8, wherein the storage unit comprises:
an input section configured to receive the information data in response to a test clock signal; and
a control signal generation section configured to transmit data inputted through the input section as a control signal in response to the first test mode signal and latch the control signal in response to the test clock signal.

10. The semiconductor system of claim 9, wherein the storage unit further comprises:
a buffer section configured to buffer the control signal and output the buffered signal as the output data; and
a test clock generation section configured to generate the test clock signal in response to the control signal and the pulse signal.

11. A semiconductor memory device comprising:
a memory unit configured to output data stored in a memory cell by a write operation as test data in synchronization with a read clock signal generated in response to a read command;
a sense amplification unit configured to sense and amplify the test data in synchronization with a delayed clock signal generated by delaying the read clock signal and output the amplified data as the information data;
a pulse generation unit configured to generate a pulse signal including a pulse generated when the level of the information data changes; and
a storage unit configured to store the information data in response to the pulse signal.

12. The semiconductor memory device of claim 11, wherein the storage unit outputs the stored information data as output data in response to a first test mode signal.

13. The semiconductor memory device of claim 12, further comprising an output control unit configured to output the output data to a data pad in response to a second test mode signal.

14. The semiconductor memory device of claim 11, wherein the sense amplification unit comprises:
a driving section configured to receive the test data and drive an internal node in synchronization with the delayed clock signal; and
a precharge buffer section configured to precharge the internal node, buffer a signal of the internal node, and output the buffered signal as the information data during a read operation period.

15. The semiconductor memory device of claim 11, wherein the pulse generation unit generates a pulse in response to a falling edge of the information data.

16. The semiconductor memory device of claim 11, wherein the storage unit generates the output data by latching a control signal precharged in response to a first test mode signal, and generates the output data by receiving and latching the information data when a pulse of the pulse signal is generated.

17. The semiconductor memory device of claim 16, wherein the storage unit comprises:
an input section configured to receive the information data in response to a test clock signal; and
a control signal generation section configured to transmit data inputted through the input section as a control signal in response to the first test mode signal, and latch the control signal in response to the test clock signal.

18. The semiconductor memory device of claim 17, wherein the storage unit comprises:
a buffer section configured to buffer the control signal and output the buffered signal as the output data; and
a test clock generation section configured to generate the test clock signal in response to the control signal and the pulse signal.

* * * * *